United States Patent
Kim et al.

(10) Patent No.: US 8,614,452 B2
(45) Date of Patent: Dec. 24, 2013

(54) LIGHT-EMITTING DIODE HAVING ZINC OXIDE NANORODS AND METHOD OF FABRICATING THE SAME

(75) Inventors: Ki-Seok Kim, Gwangju (KR); Gun-Young Jung, Gwangju (KR); Sang-Mook Kim, Gwangju (KR); Mun-Seok Jeong, Gwangju (KR); Hyun Jeong, Gwangju (KR)

(73) Assignee: Gwangju Institute of Science and Technology, Gwangju (KR)

( * ) Notice: Subject to any disclaimer, the term of this patent is extended or adjusted under 35 U.S.C. 154(b) by 232 days.

(21) Appl. No.: 13/094,338

(22) Filed: Apr. 26, 2011

(65) Prior Publication Data

US 2011/0260191 A1  Oct. 27, 2011

Related U.S. Application Data

(60) Provisional application No. 61/328,070, filed on Apr. 26, 2010.

(51) Int. Cl.
 *H01L 33/00* (2010.01)

(52) U.S. Cl.
 USPC ......... 257/98; 257/E33.067; 438/31; 977/949

(58) Field of Classification Search
 USPC ................ 257/98, E33.067; 438/31; 977/949
 See application file for complete search history.

(56) References Cited

U.S. PATENT DOCUMENTS

| | | | |
|---|---|---|---|
| 6,882,051 B2 * | 4/2005 | Majumdar et al. ............ | 257/746 |
| 7,955,889 B1 * | 6/2011 | Yang et al. ..................... | 438/82 |
| 2006/0115916 A1 * | 6/2006 | Lee et al. ....................... | 438/29 |
| 2006/0118803 A1 * | 6/2006 | Lee et al. ....................... | 257/98 |
| 2010/0230667 A1 * | 9/2010 | Nakamura et al. ............ | 257/40 |
| 2010/0330716 A1 * | 12/2010 | Tyan et al. ..................... | 438/29 |
| 2011/0062481 A1 * | 3/2011 | Oyamada ....................... | 257/98 |
| 2011/0114921 A1 * | 5/2011 | Yang et al. ..................... | 257/40 |
| 2011/0248256 A1 * | 10/2011 | Cok et al. ....................... | 257/40 |
| 2011/0284907 A1 * | 11/2011 | Nakamura et al. ............ | 257/98 |
| 2011/0297993 A1 * | 12/2011 | Cho et al. ....................... | 257/98 |

OTHER PUBLICATIONS

Enhancement of Light Extraction Through the Wave-Guide Effect ofZnO Sub-Microrods in InGaN Blue Light-Emitting Diodes; Ki Seok Kim et al.; Advanced Functional Materials; 2010; vol. 20; pp. 1076-108.*

Enhancement of Light Extraction Through the Wave-Guide Effect of ZnO Sub-Microrods in InGaN Blue Light-Emitting Diodes; Ki Seok Kim et al.; Advanced Functional Materials; 2010; vol. 20; pp. 1076-1082.

* cited by examiner

*Primary Examiner* — Victor A Mandala
(74) *Attorney, Agent, or Firm* — Osha Liang LLP

(57) ABSTRACT

The light extraction efficiency of a typical light-emitting diode (LED) is improved by incorporating one-dimensional ZnO nanorods. The light extraction efficiency is improved about 31% due to the waveguide effect of ZnO sub-microrods, compared to an LED without the nanorods. Other shapes of ZnO microrods and nanorods are produced using a simple non-catalytic wet chemical growth method at a low temperature on an indium-tin-oxide (ITO) top contact layer with no seed layer. The crystal morphology of a needle-like or flat top hexagonal structure and the density and size of ZnO microrods and nanorods are easily modified by controlling the pH value and growth time. The waveguide phenomenon in each ZnO rod is observed using confocal scanning electroluminescence microscopy (CSEM) and micro-electroluminescence spectra (MES).

12 Claims, 15 Drawing Sheets

LIGHT-EMITTING DIODE HAVING ZINC OXIDE NANORODS AND METHOD OF FABRICATING THE SAME

BACKGROUND OF THE INVENTION

1. Field of the Invention

The present invention relates to a light-emitting diode and a method of fabricating the same, and more particularly, to a light-emitting diode to which zinc oxide (ZnO) nanorods are applied and a method of fabricating the same.

2. Description of the Related Art

GaN-based light-emitting diodes (LEDs) have recently attracted much attention in the field of light-emitting devices, communication devices, and large displays. Especially, their inherent properties such as miniaturization, high brightness, reliable long-lifetime, short response time, and low energy consumption provide significant advantages over existing light-emitting devices.

Nevertheless, the external quantum efficiency (EQE) of the GaN-based LEDs, which is closely associated with their internal quantum efficiency (IQE) and light extraction efficiency (LEE), is still quite low in typical $In_xGa_{1-x}N/GaN$ quantum well (QW) structures. One of the primary reasons for the low EQE results from the low light extraction efficiency, which is mainly caused by light loss due to the total internal reflection (TIR) occurring at the interface between the structure of the LED and the air or encapsulating material. The refractive indices of p-GaN, indium-tin-oxide (ITO), and air are 2.52, 2.06, and 1, respectively, and their critical angles ($\theta_{crit}$) are based on Snell's Law:

$$\theta_{crit} = \sin^{-1}(n_1/n_2)$$

wherein $n_2$ is the refractive index of the less optically dense medium and $n_1$ is the refractive index of the more optically dense medium.

According to the previous research, the initial critical angles in the LEDs are 54.83° at the interface of p-GaN and ITO and 29.04° at the interface of ITO and air. Photons emitted over these critical angles can be reflected from and reabsorbed at the interface and internally confined. Thus, the improvement of the light extraction efficiency can be achieved by incorporating geometric structures in the LED to reduce internal reflection and increase light extraction at the interface. For example, the surface of p-GaN and/or ITO contact layer is roughened by an etching process, or a periodic pattern including a photonic crystal structure is fabricated by laser holographic lithography, e-beam lithography, and nanoimprint technology to improve the light extraction efficiency. However, it was found that the plasma process induced damage to the surface during the process, which, in turn, caused deterioration in electrical properties.

Recently, ZnO has been introduced as one of the most promising materials for short wavelength LEDs and laser diode applications using its inherent wide and direct bandgap of 3.37 eV. In addition, ZnO films have higher transparency and lower cost than ITO films. However, the application of ZnO to homojunction diodes is limited because of difficulties in fabricating a high quality ZnO film and conducting p-type doping on the ZnO film due to its intrinsic n-type properties. As an alternative approach to the use of the ZnO for optoelectronic applications, a ZnO/GaN heterojunction structure has been suggested. However, these heterojunction diodes have low efficiency due to high energy barrier at the junction interface. Another approach to improve the light extraction efficiency is to form an LED using ZnO nanorods on a ZnO transparent conductive layer. In this case, although improvement of light extraction efficiency is achieved, the LED having the ZnO nanorods exhibits low current spreading and electrical performance compared to typical ITO-based LEDs.

SUMMARY OF THE INVENTION

Accordingly, the present invention has been made in an effort to solve the above-described drawbacks, and an object of the present invention is to provide a light-emitting diode and a method of fabricating the same, which can improve light extraction efficiency.

In an aspect, the present invention provides a light-emitting diode comprising: a light-emitting structure for generating light; and a light waveguide layer having zinc oxide rods positioned along the propagation path of light generated in the light-emitting structure, each zinc oxide rod emitting the light from the (0001) plane with a flat top facet.

In another aspect, the present invention provides a method of fabricating a light-emitting diode, the method comprising: immersing a light-emitting structure in a growth solution; and forming a light waveguide layer having zinc oxide rods on the light-emitting structure in the growth solution, each zinc oxide rod emitting light generated in the light-emitting structure from the (0001) plane with a flat top facet, wherein the light waveguide layer is formed without using a seed layer.

In the present invention, ZnO rods having a diameter of sub-micron and applied to a light-emitting diode with a multiple quantum well (MQW) structure are grown at a low temperature on a current spreading layer, an n-type cladding layer, or a p-type cladding layer using a simple non-catalytic wet-chemical growth method.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE INVENTION

Figure 1:
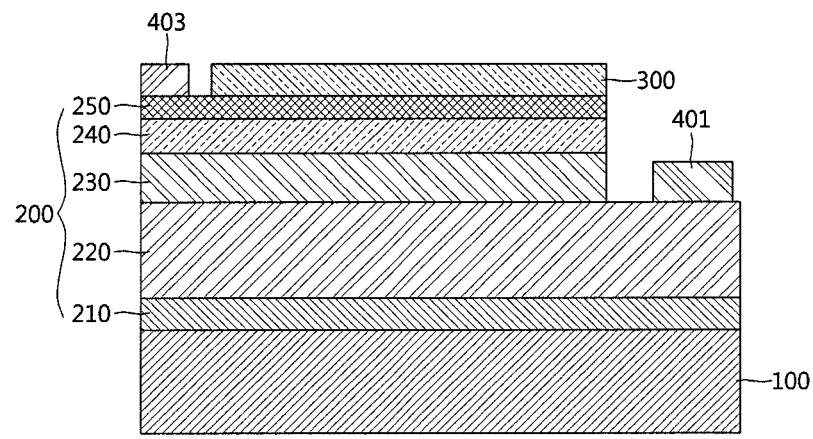
FIG. 1 is a cross-sectional view showing a light-emitting diode in accordance with a preferred embodiment of the present invention.

As the invention allows for various changes and numerous embodiments, particular embodiments will be illustrated in the drawings and described in detail in the written description. However, the present invention is not limited to the specific embodiments and should be construed as including all the changes, equivalents, and substitutions included in the spirit and scope of the present invention. In the following description and drawings, like components refer to like reference numerals.

Unless otherwise defined, all terms used herein, including technical or scientific terms, have the same meanings as those generally understood by those with ordinary knowledge in the field of art to which the present invention belongs. Such terms as those defined in a generally used dictionary are to be interpreted to have the meanings equal to the contextual meanings in the relevant field of art, and are not to be interpreted to have ideal or excessively formal meanings unless clearly defined in the present application.

Hereinafter, exemplary embodiments of the present invention will be described in detail with reference to the accompanying drawings.

Exemplary Embodiments

FIG. 1 is a cross-sectional view showing a light-emitting diode in accordance with a preferred embodiment of the present invention.

Referring to FIG. 1, a light-emitting diode comprises a light-emitting structure 200 and a light waveguide layer 300, which are formed on a substrate 100.

The light waveguide layer 300 is formed on the light-emitting structure 200 and positioned in the direction in which light generated in the light-emitting structure 200 is emitted to the outside.

Moreover, the light-emitting structure 200 comprises a buffer layer 210, an n-type cladding layer 220, a light-emitting layer 230, a p-type cladding layer 240, and a current spreading layer 250.

Preferably, the substrate 100 may have a crystalline structure, on which the buffer layer 210 or the n-type cladding layer 220 can be formed. Therefore, the substrate 200 may have a crystalline structure the same as or similar to that of the buffer layer 210 or the n-type cladding layer 220.

Therefore, the substrate 100 may be a glass substrate, a sapphire substrate, an ITO substrate, a silicon substrate, a GaN substrate, a SiC substrate, a ZnO substrate, a GaAs substrate, an InP substrate, an AlN substrate, a ScAlMgO$_4$ substrate, or a LiNbO$_3$ substrate. Moreover, the substrate 100 may be provided as a specific layer, not a physical substrate.

The buffer layer 210 is provided on the substrate 100. The buffer layer 210 is interposed between the substrate 100 and the n-type cladding layer 220 to solve the mismatch of crystal lattices between the substrate 100 and the n-type cladding layer 220. Thus, when the mismatch of crystal lattices is solved and the n-type cladding layer 220 has excellent single crystal characteristics, the buffer layer 210 can be eliminated. Moreover, the buffer layer 210 is formed of a material the same as or similar to that of the n-type cladding layer 220. Especially, when the n-type cladding layer 220 comprises GaN, the buffer layer 210 may also comprise GaN and, in certain exemplary embodiments, the buffer layer 210 may comprise AlN.

The n-type cladding layer 220 is provided on the buffer layer 210. The n-type cladding layer 220 has the composition of a compound semiconductor. Therefore, the n-type cladding layer 220 may have the composition of II-VI group or III-V group. ZnO may be used as a typical II-VI group compound semiconductor, and GaN may be used as a typical III-V group compound semiconductor.

When the n-type cladding layer 220 comprises GaN, a IV group element may be used as a dopant. Especially, Si may be mainly used as the IV group element. Moreover, a first electrode 401 is formed partially on the n-type cladding layer 220.

The light-emitting layer 230 is provided on the n-type cladding layer 220. The light-emitting layer 230 may have a quantum dot structure or a quantum well structure. Especially, when the n-type cladding layer 220 comprises GaN, the light-emitting layer 230 may also comprise GaN.

Subsequently, the p-type cladding layer 240 is formed on the light-emitting layer 230. The p-type cladding layer 240 has the composition of a compound semiconductor. Therefore, the p-type cladding layer 240 may have the composition of II-VI group or III-V group. ZnO may be used as a typical II-VI group compound semiconductor, and GaN may be used as a typical III-V group compound semiconductor.

For example, when the p-type cladding layer 240 comprises GaN, a II group element may be used as a dopant, and Mg may be mainly used as the II group element.

The current spreading layer 250 is provided on the p-type cladding layer 240. The current spreading layer 250 comprises a transparent conductor such as ITO, IZO, etc. Moreover, the current spreading layer 250 is provided to form an ohmic junction with a second electrode 403 which will be formed later.

The light waveguide layer 300 is formed on the p-type cladding layer 240. The light waveguide layer 300 comprises ZnO nanorods. Moreover, the ZnO nanorods of the light waveguide layer 300 are formed with a preferred c-axis orientation. Especially, when the ZnO nanorods are grown under specific pH conditions, the growth plane of each nanorod has a flat shape. That is, the (0001) plane has a flat shape.

Moreover, the light waveguide layer 300 does not require a separate seed layer for inducing growth. That is, when a light-emitting diode structure in which electrodes are formed is put into a growth solution and subjected to hydrothermal synthesis, the light waveguide layer 300 may be formed. The growth solution may comprise zinc nitrate tetrahydrate (Zn(NO$_3$)$_2$.4H$_2$O) and hexamethyltetramine (C$_6$H$_{12}$N$_4$). Moreover, an ammonia solution (NH$_4$(OH)) may be added to control the pH of the growth solution.

For example, when the light-emitting diode structure is put into the growth solution and the hydrothermal synthesis is performed at pH 7 in a state where the second electrode 403 is formed on the current spreading layer 250, the top facet of each ZnO nanorod has a flat shape by the growth solution. Moreover, the light generated in the light-emitting layer 230 is emitted through the flat top facet of the nanorod.

In the present embodiment, the current spreading layer 250 is provided on the p-type cladding layer 240, and the nanorods which function as light waveguides are grown on the current spreading layer 250 in a particular growth solution under specific pH conditions without the use of a seed layer.

However, the nanorods, which do not require the seed layer, may be formed directly on the p-type cladding layer or the n-type cladding layer. This results from the fact that the crystalline structure of the p-type cladding layer or the n-type cladding layer has a hexagonal system. That is, the nanorods may be more readily formed on the p-type cladding layer or the n-type cladding layer having a crystalline structure the same as or similar to the ZnO crystalline structure.

Furthermore, while the light waveguide layer is formed on the current spreading layer in FIG. 1, the light waveguide layer may be formed on the p-type cladding layer or on the n-type cladding layer according to the shape of a chip. For example, when the light-emitting diode has a vertical structure, the light waveguide layer may be formed on the p-type cladding layer or the n-type cladding layer which forms a stacking structure thereon.

1. Fabrication of Light-Emitting Diodes

A GaN-based LED is fabricated to emit blue light having a central wavelength of 453 nm. Moreover, ZnO nanorods are provided on the LED. A blue LED with a commercialized $In_xGa_{1-x}N/GaN$ multiple quantum well (MQW) structure is fabricated on a c-face sapphire substrate by metal-organic chemical vapor deposition (MOCVD). The sapphire substrate has a periodic lens pattern, which has a diameter of 3 um, an interval of 2 um, and a depth of 1.5 um. A GaN nucleation layer having a thickness of 30 nm is provided on the sapphire substrate. A buffer layer is formed with a thickness of 3 um, and a Si-doped n-type cladding layer is formed with a thickness of 2.5 um. The MQW structure is formed by repeatedly stacking InGaN/GaN five times. Moreover, a Mg-doped p-type cladding layer has a thickness of 0.14 um. An n-ohmic contact region is formed by photolithography followed by etching of the n-type cladding layer. ITO is used to form a current spreading layer on the p-type cladding layer. Finally, a Cr/Ni/Au (20/30/500 nm in thickness) layer is deposited on the surface of an exposed n-type cladding layer to form an n-ohmic contact.

2. Growth of ZnO Nanorods

The LED chip fabricated in the above-described method is washed with isopropyl alcohol and deionized water. Then, the resulting chip is immersed in a 50 mL growth solution containing zinc nitrate tetrahydrate ($Zn(NO_3)_2 \cdot 4H_2O$, 20.82 g, 70 mmol, 99.5% purity, Aldrich) and hexamethyltetramine ($C_6H_{12}N_4$, 9.11 g, 65 mmol, 99.5% purity, Aldrich) to allow ZnO rods to grow. At different pH values, the ZnO rods grow into different shapes, which can be controlled by adding an ammonia solution ($NH_4(OH)$, 28 wt %, Aldrich). For example, the ammonia solution is used in an amount of 2 to 4 ml to maintain the pH value at 7 to 10. The reaction is carried out at 90° C. for 6 to 12 hours, and the pH is maintained at a constant value to form ZnO rods having different densities.

3. The Morphology and Structure of Grown ZnO Microrods and Sub-Microrods (Nanorods)

ZnO microrods and sub-microrods are grown on an ITO top contact layer by a typical process capable of controlling the pH. From the previous studies, the crystal morphology of the ZnO rods is determined sensitively by various reaction parameters such as growth temperature, pH, growth time, seed crystals, and impurities.

The pH and growth time are controlled in this exemplary embodiment to differentiate the morphologies and densities of ZnO microrods and sub-microrods.

FIGS. 2 to 5 are field emission scanning electron microscopy (FESEM) images of ZnO microrods and sub-microrods grown with no directional preference under different growth conditions.

Figure 2:
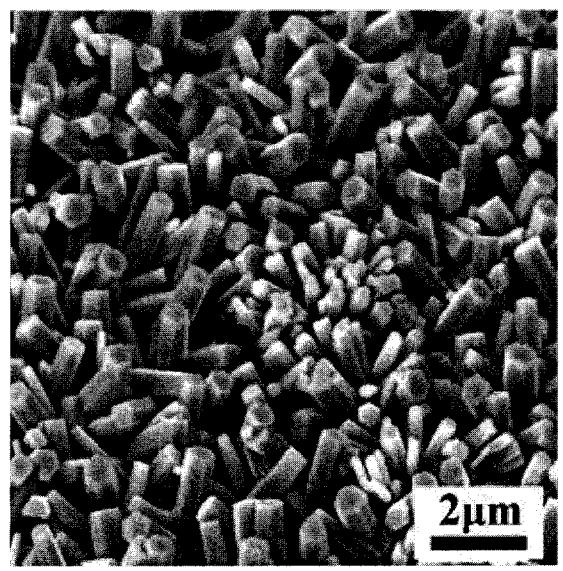
FIGS. 2 to 5 are FESEM images of ZnO microrods/sub-microrods in accordance with a preferred embodiment of the present invention.
Figure 3:
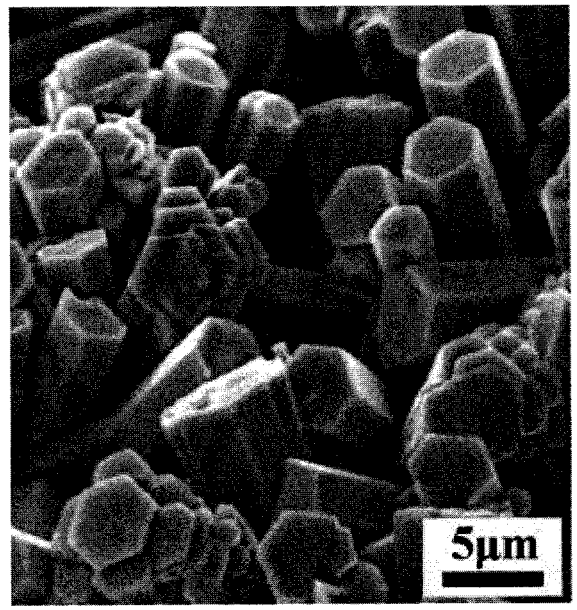

Referring to FIGS. 2 and 3, at pH 7, each ZnO rod has a well-faceted hexagonal wurtzite crystal structure with a flat top facet.

Figure 4:
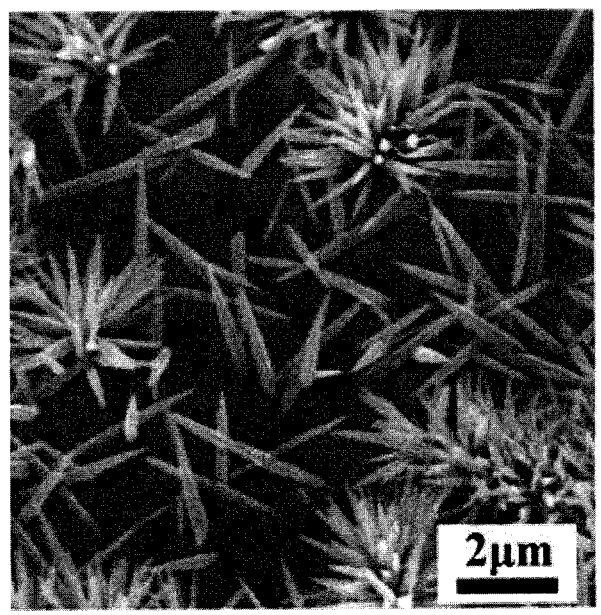
Figure 5:
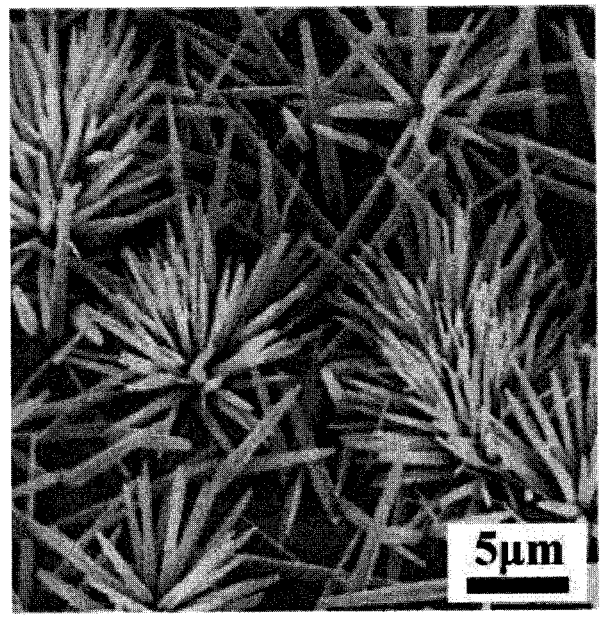

Moreover, referring to FIGS. 4 and 5, it is observed that the hexagonal shape of the ZnO rod changes to a needle-like shape as the pH value increases from 7 to 10, regardless of the growth time. It is believed that this is because of the competition between the growth and erosion mechanisms. The hexagonal wurtzite ZnO crystal is a polar crystal with a dipole moment in the direction of the c-axis. Therefore, the (0001) crystal plane has a polarity and is thus in a meta-stable state. On the contrary, the side planes are nonpolar and are in a relatively stable state. For these reasons, the polar top facet is apt to be attracted to $OH^-$ in a solution. Therefore, the (0001) crystal plane grows or erodes at different rates depending on the amount of $OH^-$ present.

At pH 10, more $OH^-$ ions are generated by hydrolysis when the solution is heated. As a result, all $OH^-$ ions are not consumed during the growth period. Instead, the excess $OH^-$ in the solution takes part in the erosion reaction according to the following formula 1:

$$ZnO + OH^- \rightarrow ZnO_2^{2-} + H_2O. \quad \text{[Formula 1]}$$

This erosion mechanism occurs more intensely as the pH increases. The reason for this is that the growth mechanism occurs faster than erosion, and the needle-like ZnO morphology is formed as shown in FIGS. 4 and 5.

On the contrary, at pH 7, most of the $OH^-$ in the solution participates in a two-step growth reaction represented by the following formula 2:

$$Zn^{2+} + 4OH^- \rightarrow Zn(OH)_4^{2-} \rightarrow ZnO + H_2O + 2OH^- \quad \text{[Formula 2]}$$

wherein $Zn(OH)_4^{2-}$ is an intermediate product and acts as a growth factor.

The growth time contributes to both the volume expansion and the length growth of the original rods.

Here, the wurtzite ZnO rods grow at a rate of ~1 μm per hour along the c-axis and, at the same time, expand laterally to merge with adjacent rods as shown in FIG. 3. The diameter of the ZnO rods grown at pH 7 for 6 to 12 hours is approximately 500 nm to 2.5 μm.

To confirm the single crystallinity of the ZnO nanorods, the results of the transmission electron microscopy (TEM) and Raman scattering data are analyzed. A detailed structural characterization of the ZnO rod arrays formed under different pH conditions is conducted using TEM.

FIGS. 6 to 10 are TEM images and high-resolution TEM (HRTEM) images of ZnO rods grown under different pH conditions (at pH 7 and pH 10).

Figure 6:
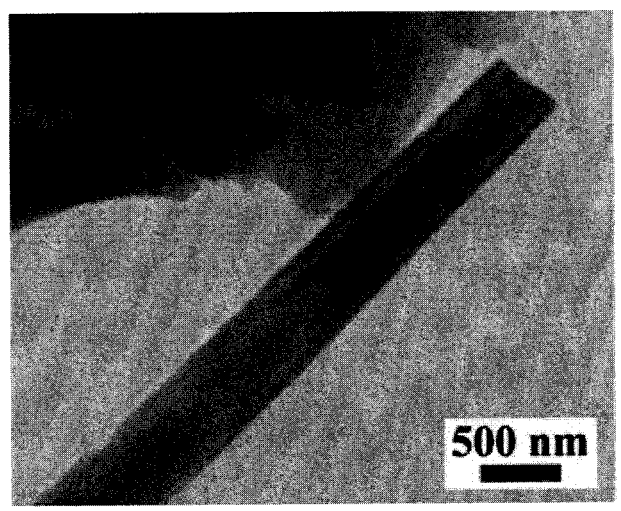
FIGS. 6 to 11 are TEM images, Raman spectra, and SAED patterns of ZnO rods in accordance with a preferred embodiment of the present invention.
Figure 7:
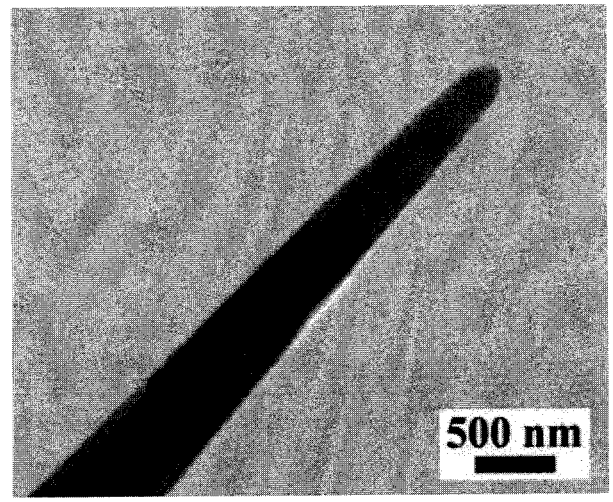

The TEM images of FIGS. 6 and 7 show a change in shape at different pH values. Well-faceted ZnO nanorods with a flat top facet of FIG. 6 and needle-like ZnO rods of FIG. 7 are grown at pH 7 for 6 hours and at pH 10 for 6 hours, respectively.

Figure 8:
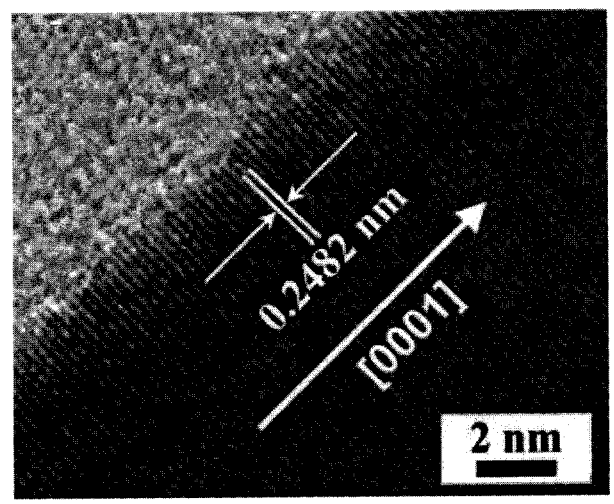
Figure 9:
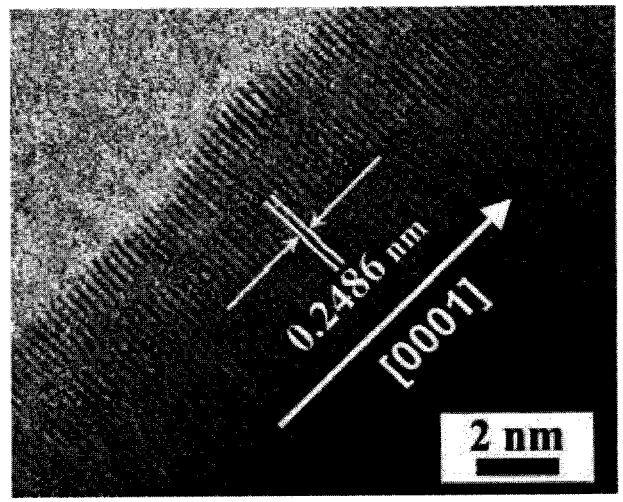

In the HRTEM images of FIGS. 8 and 9, clear lattice fringes can be observed, from which it can be seen that most of the ZnO rods with a flat top facet and the needle-like ZnO rods are defect-free single crystal structures.

Figure 10:
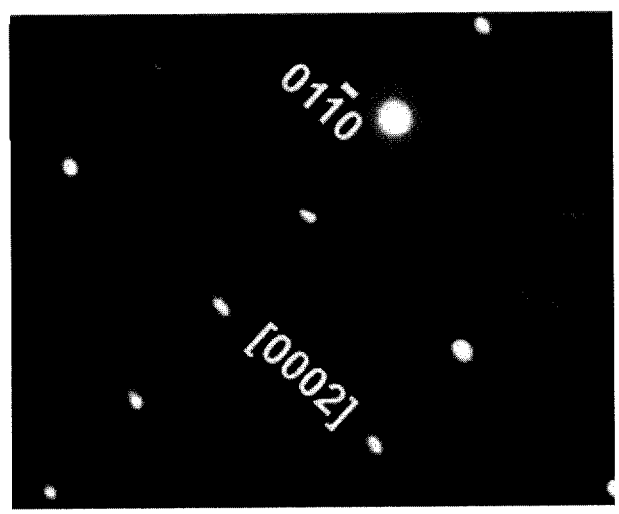

The spacing of 2.48±0.05 Å between adjacent lattice planes corresponds to the distance between two [0002] crystal planes, from which it can be seen that [0001] is the growth direction of the well-faceted ZnO nanorods with a flat top facet and the needle-like ZnO rods. In addition, as shown in FIG. 10, the selected-area electron diffraction (SAED) pattern shows the [0002] diffraction pattern, and this confirms that the single crystals grow in the c-axis direction.

Figure 11:
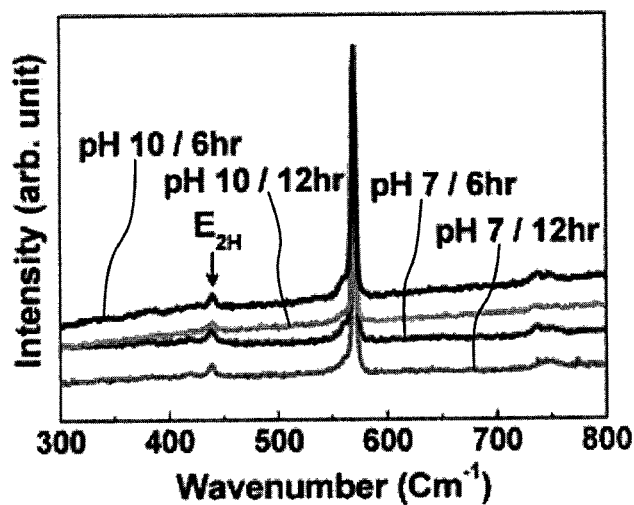

FIG. 11 shows the Raman scattering spectra measured using full device structures of GaN-based LEDs with ZnO rods grown under different conditions.

Referring to FIG. 11, a micro-Raman spectrometer (Renishaw, RM 1000) is used to observe the Raman scattering spectrum from a specific region on the sample surface with a HeNe laser (632.8 nm). Since the laser beam can be focused on a spot having a diameter of about 1 μm, the Raman spectra can represent either several nanorods or a single nanorod.

The micro-Raman spectra of the ZnO nanorods, which are grown under different conditions such as at pH 7 for 6 hours and at pH 10 for 12 hours, respectively, are measured.

The hexagonal wurtzite ZnO structure belongs to the space group $C^6_{4v}$ with $Zn^{2+}$ and $O^{2-}$ ions in the primitive cell, and the optical phonons at point Γ in the Brillouin zone have the following equation 1:

$$\Gamma_{opt} = 1A_1 + 2B_1 + 1E_1 2E_2. \quad \text{[Equation 1]}$$

Among six lattice vibration modes, only two nonpolar $E_2$ modes (such as $E_2$ high and $E_2$ low modes) are Raman active and correspond to optical phonon modes of crystals having a hexagonal wurtzite phase. In addition, peaks at 438.2 and 568.8 cm$^{-1}$ are observed in all samples, which represent the $E_2$ high mode of ZnO and the $E_2$ high mode of GaN, which coincides with the previous reports.

These TEM images and the results of the Raman scattering demonstrate that the single crystalline ZnO rods with a hexagonal wurtzite structure are grown using a simple non-catalytic wet-chemical growth method on an ITO top contact layer.

4. Optical Properties of ZnO Rods Grown Under Different Growth Factors

The transparency of the top contact is critical for efficient LED operation. In this regard, the general optical properties of ZnO rods grown under different conditions can be verified before fabricating the LEDs.

Figure 12:
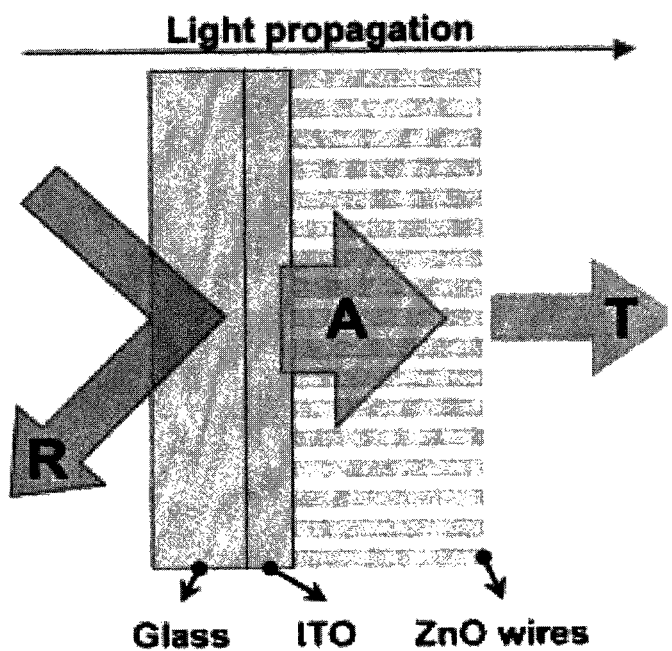
FIGS. 12 to 15 are graphs showing the analysis results of optical properties of ITO with ZnO rods in accordance with a preferred embodiment of the present invention.

FIG. 12 shows that the direction of light is the same as the light extraction path during operation of the LED. When the light propagates in the middle of any one selected from the group consisting of glass, ITO, and ZnO rods for a given distance, it undergoes absorption, reflection, and transmission. The energies absorbed (A), reflected (R), and transmitted (T) during the propagation follow the law of conservation of energy expressed by the following equation 2:

$$A+R+T=1. \quad \text{[Equation 2]}$$

Here, the energy is normalized, i.e., differentiated.

Figure 13:
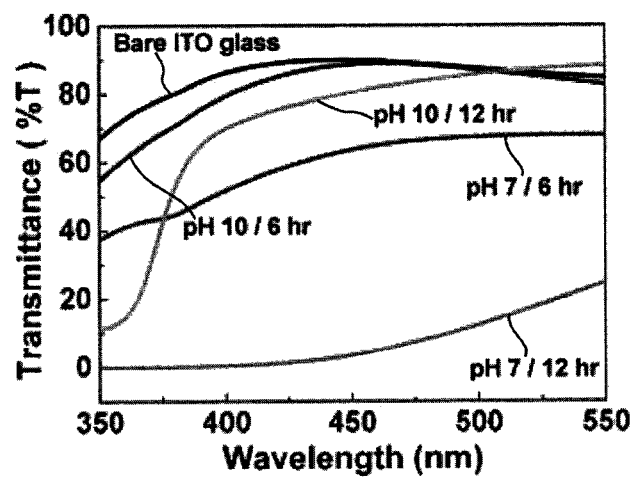

FIG. 13 shows the optical transparency through the ITO with various ZnO rods, from which it can be seen that all the modified samples exhibit low transmittance compared to the ITO without the ZnO rods. In fact, the transparency is heavily dependent on the size and density of the rods as the microrods, which are grown at pH 7 for 12 hours and excessively concentrated, exhibit a normal spectrum with only 5% transparency over the entire wavelength. In comparison, the spectra from the samples with sparse needle-like rods grown at pH 10 for 6 and 12 hours, respectively, are close to that of the referenced ITO.

Figure 14:
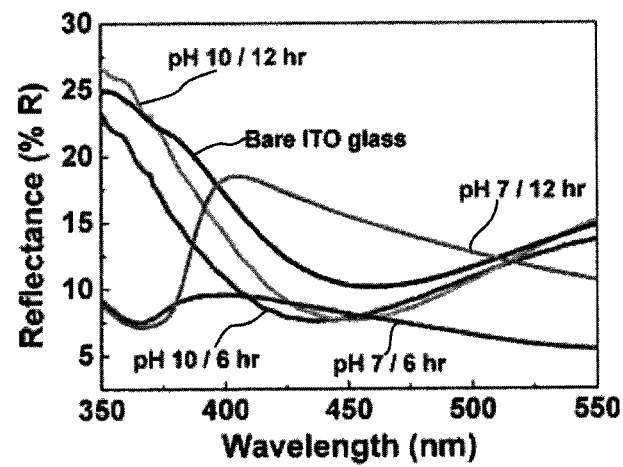
Figure 15:
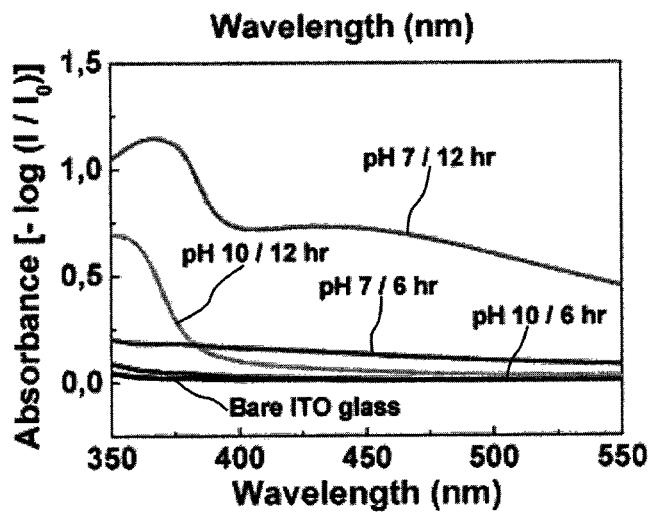

FIGS. 14 and 15 show the reflectance and absorbance spectra, respectively. Both the needle-like ZnO rods grown at pH 10 for 6 and 12 hours, respectively, and the ZnO microrods with a flat top facet grown at pH 7 for 6 hours have lower reflectance than the ZnO microrods with a flat top facet grown at pH 7 for 12 hours in the electroluminescent wavelength range of 425 to 500 nm emitted from the LEDs. In addition, the ZnO microrods with a flat top facet exhibit much higher absorption over the entire wavelength range. Therefore, the high reflectance and absorption of ZnO microrods grown at pH 7 for 12 hours reduces the transmission. On the contrary, other ZnO nanorods grown under different conditions have much lower reflectance and absorbance, thereby making it possible for more light to penetrate through the interface of glass/ITO/ZnO rods. Interestingly, the needle-like ZnO rods grown at pH 10 exhibit an optical absorption similar to that of the ITO glass, which illustrates that the density of the needle-like rods is not high.

5. Properties of ZnO Microrods/Nanorods Applied to InGaN-Based Blue LEDs

Figure 16:
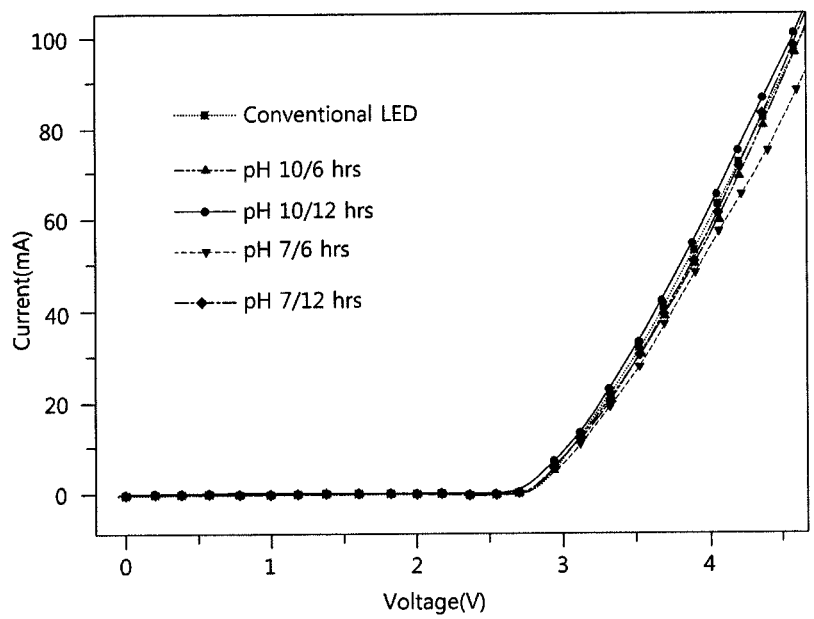
FIGS. 16 to 18 are graphs showing the optical properties of light-emitting diodes having ZnO rods with a MQW structure in accordance with a preferred embodiment of the present invention.
Figure 17:
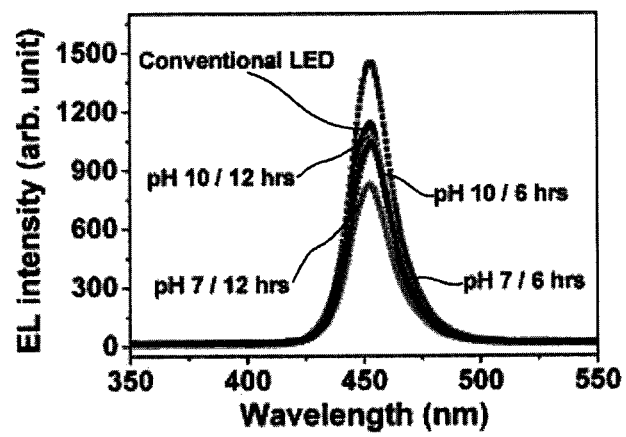
Figure 18:
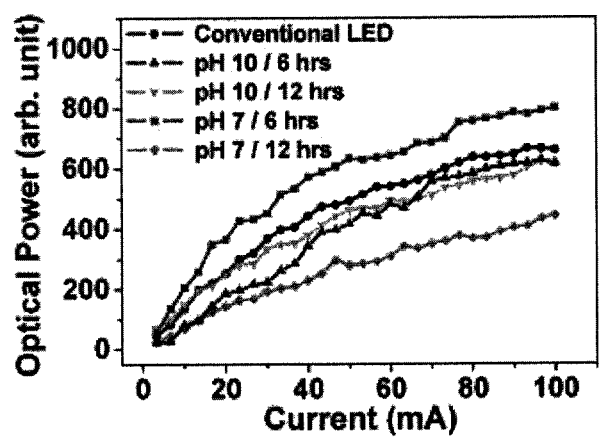

FIGS. 16 to 18 show the current-voltage characteristics, the electroluminescence (EL) spectra at a forward injection current of 20 mA, and the light output power-injection current (L-I) characteristics, respectively.

Moreover, the ZnO microrods and nanorods are grown on the ITO surface without any influence on the current spreading in the LED. Furthermore, the LEDs with and without the ZnO rods exhibit the same EL spectra.

This indicates that a blue peak is observed at a wavelength of 453 nm. That is, the formation of ZnO rods does not cause any defect or damage to the GaN-based LED structure. The EL intensity increases about 31% when the ZnO nanorods grown at pH 7 for 6 hours are applied to the LED, compared to the reference LED. This is contrary to the results of the transmittance, in which the above sample has low transmittance at 453 nm. That is, in FIG. 13, the transmittance of the above sample is reduced about 20% compared to the reference LED to which only the ITO is applied. In the case of the needle-like ZnO nanorods grown at pH 10, the EL intensity is not increased even though they have higher transmittance than the ZnO nanorods with a flat top facet grown at pH 7 for 6 hours as shown in FIG. 7.

This means that the mechanism of EL increase cannot be sufficiently explained only by the measurement of the transmittance under normal incidence conditions. This is because the emitted photons diffuse along the slab structure inside the LEDs. A similar behavior is illustrated in L-I characteristics, as shown in FIG. 18.

6. Analysis of Confocal Scanning Electroluminescence Microscopy (CSEM) Images To investigate the EL properties of the ZnO microrods/nanorods, confocal scanning electroluminescence microscopy (CSEM) with a spatial resolution of 200 nm is used, which is close to the spatial resolution (100 nm) of a near-field scanning optical microscope. CSEM is known as an effective tool for measuring optical properties such as light propagation and partial light output. A confocal microscope (Witec GmbH) having an objective lens with a high numerical aperture of 0.9 is used to collect the light emitted from the surface of the diode. During scanning, the diode device is connected to a static current of 5 mA through Keithley 2400s source meter. The collected light is then injected to the monochromator (Acton Spectra Pro 2000) through an optical fiber. The injected light is detected by a cooled charge coupled device (CCD) detector.

Figure 19:
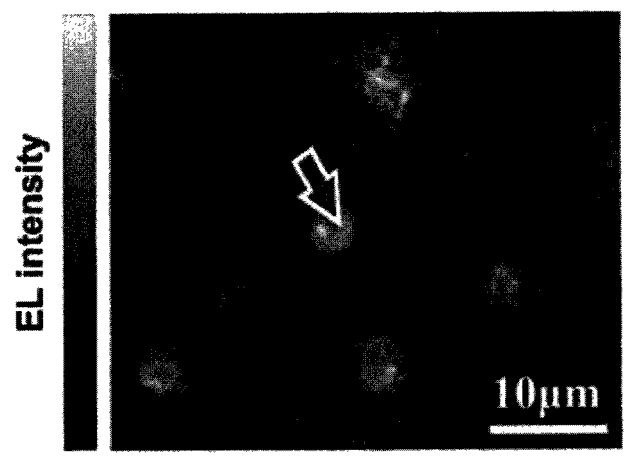
FIGS. 19 to 23 are CSEM images and SEM images of LEDs having ZnO rods and a graph showing electroluminescent (EL) properties thereof in accordance with a preferred embodiment of the present invention.
Figure 20:
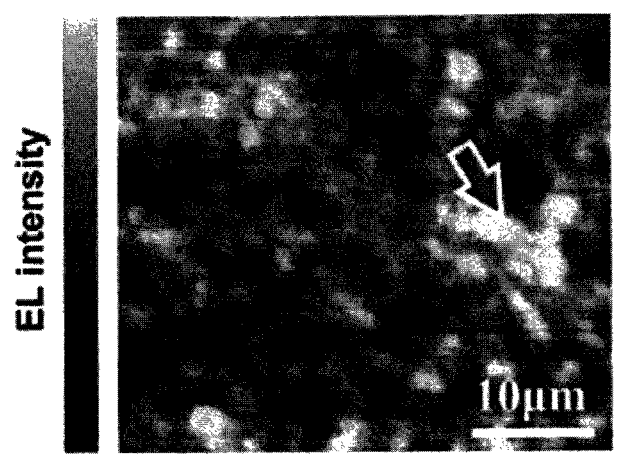

FIGS. 19 and 20 show CSEM images of the LEDs with ZnO nanorods grown at pH 10 and pH 7 for 6 hours, respectively.

It can be seen from FIG. 19 that the bright spots are uniformly distributed over the entire active area in the LED formed at pH 7. On the contrary, it can be seen from FIG. 20 that the LED grown at pH 10 shows sparse bright spots. The corresponding SEM images are shown in FIGS. 21 and 22.

Figure 21:
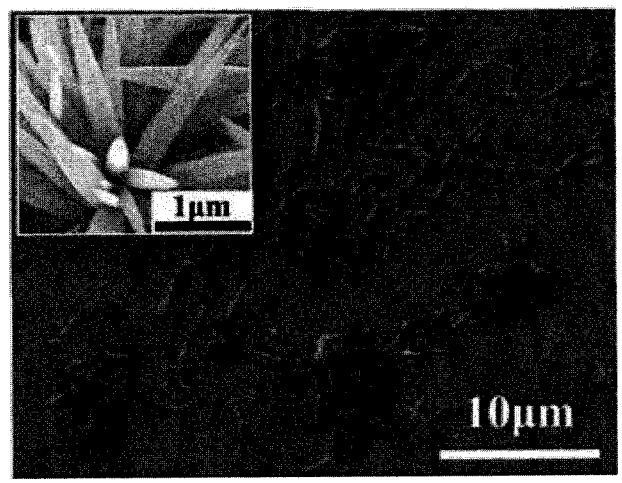
Figure 22:
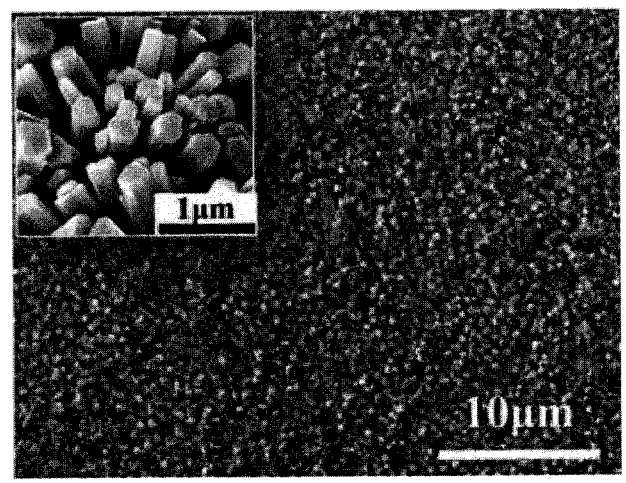

FIGS. 21 and 22 are SEM images corresponding to FIGS. 19 and 20.

Figure 23:
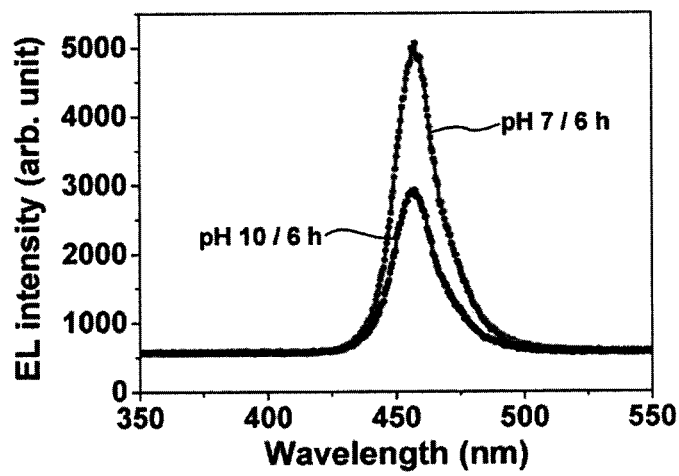

Referring to FIGS. 21 and 22, it can be seen that the bright spots coincide with the position and directionality of the grown nanorods. Especially, it can be seen from the LED grown at pH 10 that the nanorods are formed like needles and the bundle of the needle-like nanorods emits intense light. Moreover, it can be seen from the LED grown at pH 7 that the nanorods each having a relatively flat top facet are aligned vertically and exhibit strong light-emitting properties. On the contrary, the emission of light from the region where no nanorods are formed is reduced. The EL spectra shown in FIG. 23 are measured from the bright spots of FIGS. 19 and 20. That is, it can be seen that the vertically aligned ZnO nanorods exhibit increased light output.

Figure 24:
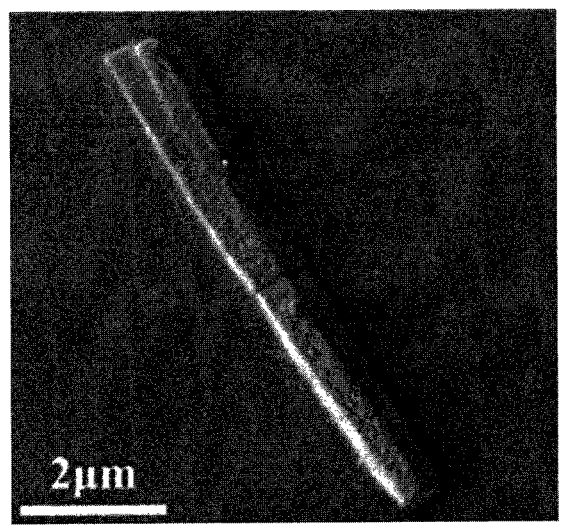
FIGS. 24 to 27 are images and graphs showing various properties under different pH conditions and current application in accordance with a preferred embodiment of the present invention.
Figure 25:
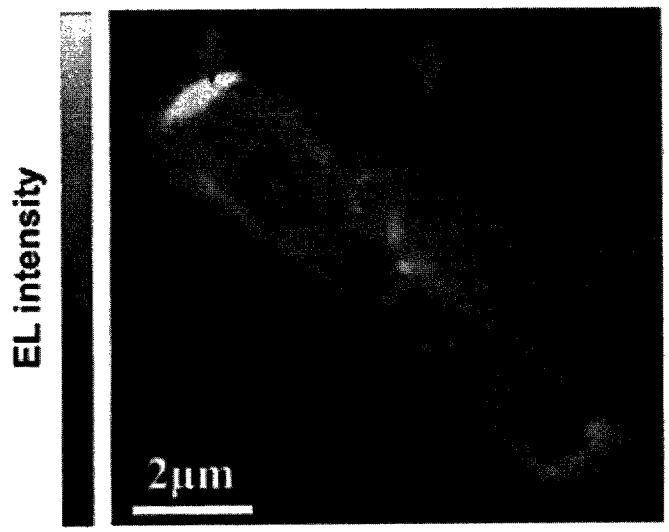

To investigate the light extraction mechanism, micrometer-scale ZnO rods are grown on the ITO surface at pH 7 for 24 hours under non-reactive conditions. As a result, as shown in FIG. 24, two ZnO rods connected to each other are formed on the ITO surface, and these ZnO rods are grown in an opposite direction. Then, the CSEM measurement is performed to observe the propagation of light at a drive current of 5 mA. The CSEM image of FIG. 25 shows the waveguide phenomenon in which the light is emitted from the hexagonal top facet. Moreover, it can be observed that some light is emitted from side facets of the rod when the light transmitted through the inside of the rod enters into the escape cone at the interface between the wall facet and air through the internal reflection. However, it can be seen that the intensity of light emitted from the top facet is much higher.

Figure 26:
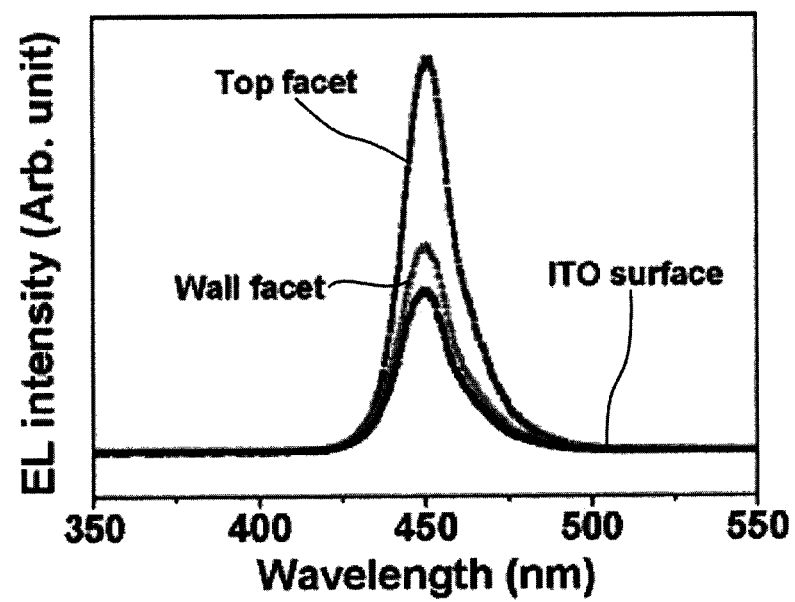
Figure 27:
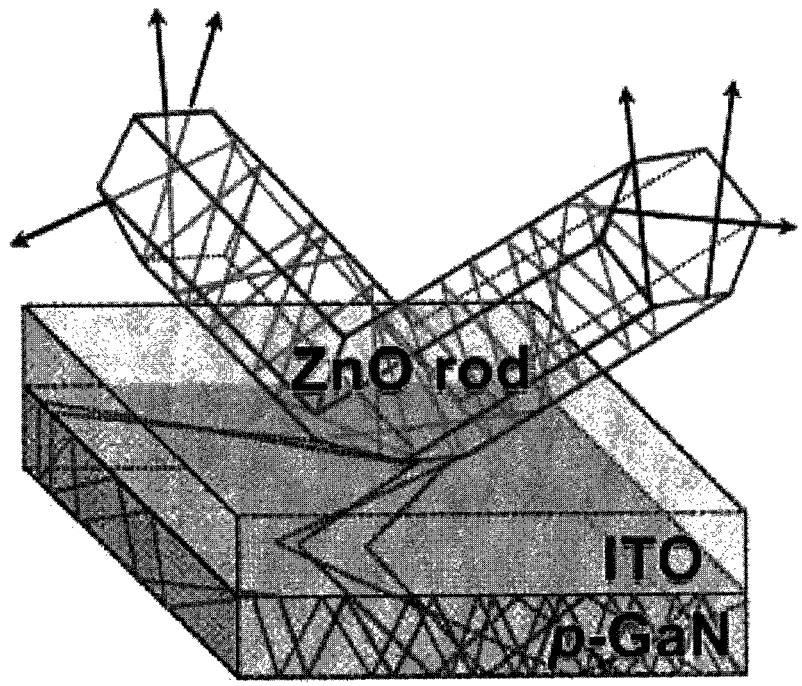

The EL spectra from the points marked in FIG. 25 are obtained from the top facet, wall facet, and ITO surface, which are compared to each other in FIG. 26. The same phenomenon as the CSEM image can be obtained from FIG. 26. That is, it can be seen that the EL intensity from the wall facet is clearly lower than that from the top facet. Of course, the EL intensity from the wall facet is higher than that from the ITO surface. Additionally, two ZnO rods are shown in FIG. 27 to demonstrate the waveguide phenomenon. Most of the photons emitted from a quantum well are easily captured by the ZnO rods being in contact with the ITO surface. This is caused by the refractive index of about 2.04 that the ZnO rod has. That is, the light transmitted through the ITO (having a refractive index of about 2.06) can be easily incident into a material having a high refractive index. Therefore, the light is easily incident into the ZnO having a refractive index higher than that of air. Such as, the waveguide phenomenon of photons occurs in the ZnO rod due to a difference in refractive index between the ZnO and air, and the guided light is finally emitted from the top facet of the rod.

7. Waveguide Effect of ZnO Microrods/Nanorods

Figure 28:
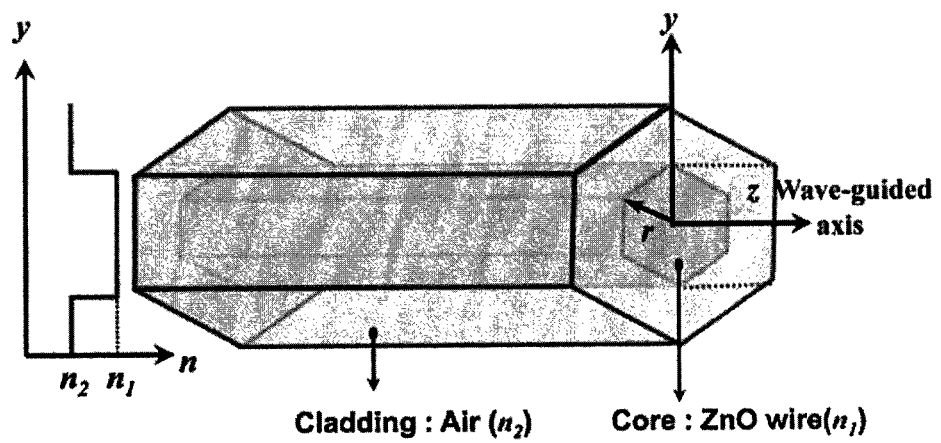
FIGS. 28 and 29 are diagrams illustrating the waveguide effect of ZnO rods in accordance with a preferred embodiment of the present invention.

To demonstrate the optical properties and the mechanism of light propagation with respect to the waveguide effect and the improved EL properties through the ZnO rods, numerical calculations of the mode distribution at a wavelength of 453 nm, which is an EL peak of the LED to which the ZnO rods are applied. A schematic of the waveguide of the ZnO rod is shown in FIG. 28. In FIG. 28, the central region of the ZnO rod has a high refractive index. In detail, refractive index n1 of the central region is about 2.04, and refractive index n2 of the outer region is about 1. Due to a difference in refractive index, the most energy from the incident light is conserved in the rod until it is emitted from the top facet to the outside. As such, the waveguide has two different modes such as a single mode and a multimode.

If the rod operates under single mode conditions, the rod transmits light to the top facet of the waveguide without loss of energy. On the contrary, under multimode conditions, a significant loss of energy is caused by the intermodal dispersion. However, the single mode conditions cannot be achieved due to a larger diameter (500 nm or greater) which exceeds the diameter of 200 nm at 453 nm as a single mode cut-off diameter.

Figure 29:
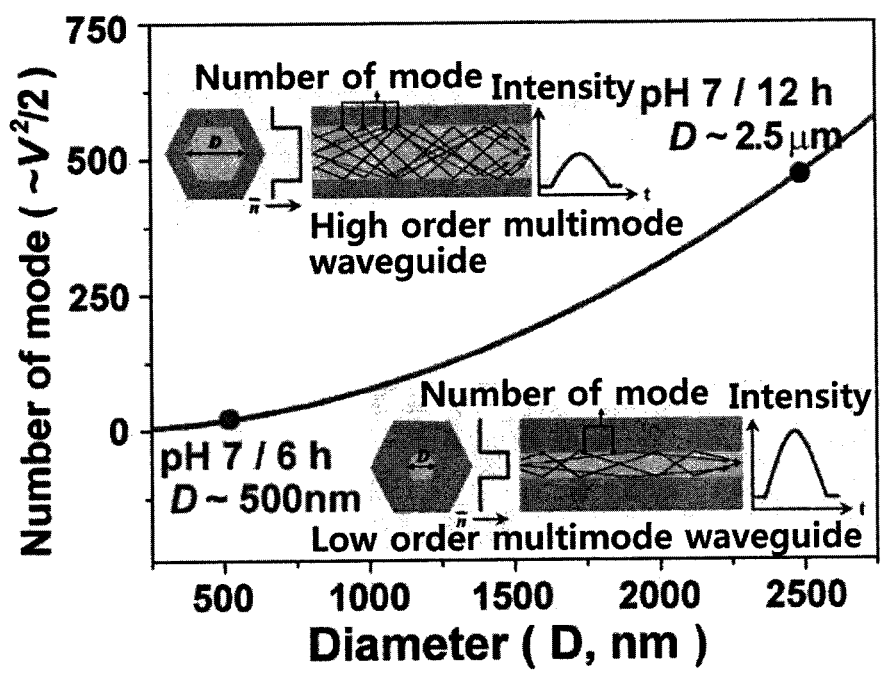

Meanwhile, it can be seen from FIG. 29 that the number of optical modes of the ZnO is determined based on the diameter of the ZnO rod at a wavelength of 453 nm. When the diameter the rod exceeds the single mode cut-off diameter corresponding to V=2.405, a plurality of modes are provided, and the ZnO operates as a high-order multimode waveguide. The multimode conditions for the waveguide of the ZnO rod must satisfy the following equation:

$$V=\pi(n^2\text{ZnO}-n^2_{Air})^{1/2} \cdot D \lambda_0 > 2.405$$

wherein D represents the diameter of the rod, $\lambda_0$ represents the wavelength, and $n_{ZnO}$ and $n_{Air}$ represent the refractive indices of ZnO and air, respectively. Moreover, the number of modes M under the multimode conditions follows the following equation:

$$M \approx V^2/2$$

Therefore, the ZnO rod grown at pH 7 for 12 hours and having a diameter of 2.5 um has a plurality of modes in a core region. This ZnO rod may have poor optical properties and exhibit lower output intensity than the nanorod grown at pH 7 for 6 hours and having a thickness of 500 nm corresponding to 20 modes. It is believed that this is caused by the intermodal dispersion.

The method disclosed in the present invention can be applied to a blue LED based on the InGaN/GaN MQW structure. Moreover, the simple wet-chemical growth method allows the ZnO nanorods to be grown on the transparent current spreading layer without the use of the seed layer, thus improving the light extraction efficiency. It can be seen that the light extraction efficiency of the LED according to the present invention increases 31% at a drive current of 20 mA, compared to the LED without the ZnO nanorods. This means that the ZnO nanorod acts as a waveguide, which is confirmed from the CSEM images and EL spectra. The findings disclosed in the present invention demonstrate that when the nearly one-dimensional nanorod has an appropriate refractive index capable of functioning as a waveguide in an optoelectronic device, it can improve the light extraction efficiency of the optoelectronic device.

As described above, the ZnO nanorods are formed along the propagation direction of light generated in the light-emitting layer. Therefore, the ZnO nanorods function as waveguides to improve the external light extraction efficiency.

Although a few embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A light-emitting diode comprising: a light-emitting structure for generating light; and a light waveguide layer having zinc oxide rods positioned along the propagation path of light generated in the light-emitting structure, each zinc oxide rod emitting the light from the (0001) plane with a flat top facet, wherein the light-emitting structure comprises a n-type cladding layer for supplying electrons, a p-type cladding layer for supplying holes, and a light-emitting layer formed between the n-type cladding layer and the p-type cladding layer which generates light by a recombination of the electrons and the holes.

2. The light-emitting diode of claim 1, wherein the light waveguide layer is formed without using a seed layer.

3. The light-emitting diode of claim 1, wherein the light-emitting structure further comprises a current spreading layer formed on the p-type cladding layer to spread current and the light waveguide layer is formed on the current spreading layer.

4. The light-emitting diode of claim 1, wherein the central region of each zinc oxide rod has a high refractive index and the outer region of each zinc oxide rod has a lower refractive index than the central region.

5. The light-emitting diode of claim 2, wherein the light waveguide layer is formed on the p-type cladding layer or on the n-type cladding layer.

6. A method of fabricating a light emitting-diode, the method comprising:

immersing a light-emitting structure in a growth solution; and forming a light waveguide layer having zinc oxide rods on the light-emitting structure in the growth solution, each zinc oxide rod emitting light generated in the light-emitting structure from the (0001) plane with a flat top facet, wherein the light waveguide layer is formed without using a seed layer.

7. The method of claim 6, wherein the growth solution comprises zinc nitrate tetrahydrate ($Zn(NO_3)_2 \cdot 4H_2O$) and hexamethyltetramine ($C_6H_{12}N_4$).

8. The method of claim 7, wherein the growth solution further comprises an ammonia solution ($NR_4(OH)$) to control the pH of the growth solution.

9. The method of claim 6, wherein the pH of the growth solution at which the zinc oxide rods are grown is 7.

10. The method of claim 6, wherein the light-emitting structure comprises:

an n-type cladding layer for supplying electrons;

a p-type cladding layer for supplying holes; and a light-emitting layer formed between the n-type cladding layer and the p-type cladding layer and generating light by a recombination of the electrons and the holes.

11. The method of claim 10, wherein the light-emitting structure further comprises a current spreading layer formed on the p-type cladding layer, and wherein the light waveguide layer is formed on the current spreading layer.

12. The method of claim 10, wherein the light waveguide layer is formed on the p-type cladding layer or on the n-type cladding layer.

* * * * *